(12) United States Patent
Guo et al.

(10) Patent No.: US 10,476,451 B2
(45) Date of Patent: Nov. 12, 2019

(54) CLASS-F POWER AMPLIFIER MATCHING NETWORK

(71) Applicant: MediaTek Inc., Hsin-Chu (TW)

(72) Inventors: Xiaochuan Guo, Austin, TX (US);
Jenwei Ko, Cupertino, CA (US);
Wen-Chang Lee, Taipei (TW);
Changhua Cao, Austin, TX (US);
Caiyi Wang, Austin, TX (US)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 15/872,740

(22) Filed: Jan. 16, 2018

(65) Prior Publication Data

US 2018/0205349 A1     Jul. 19, 2018

Related U.S. Application Data

(60) Provisional application No. 62/446,574, filed on Jan. 16, 2017.

(51) Int. Cl.
*H03F 3/217* (2006.01)
*H03F 3/191* (2006.01)
*H03F 3/45* (2006.01)
*H03F 3/24* (2006.01)
*H03F 1/56* (2006.01)
*H03F 1/02* (2006.01)
(Continued)

(52) U.S. Cl.
CPC .......... *H03F 3/191* (2013.01); *H03F 1/0211* (2013.01); *H03F 1/565* (2013.01); *H03F 3/195* (2013.01); *H03F 3/2171* (2013.01); *H03F 3/245* (2013.01); *H03F 3/45112* (2013.01); *H03F 3/45179* (2013.01); *H03H 7/0115* (2013.01); *H03F 2200/387* (2013.01); *H03F 2200/451* (2013.01); *H03F 2200/541* (2013.01); *H03F 2203/45116* (2013.01); *H03F 2203/45631* (2013.01); *H03F 2203/45638* (2013.01); *H03H 2007/013* (2013.01)

(58) Field of Classification Search
CPC .... H03F 3/191; H03F 3/2171; H03F 3/45179; H03F 3/195; H03F 1/565; H03F 3/45112; H03F 1/0211; H03F 3/245; H03H 7/0115
USPC ............ 330/124 R, 295, 252–254, 258, 251, 330/207 A
See application file for complete search history.

(56) References Cited

U.S. PATENT DOCUMENTS

| 8,164,387 B1 | 4/2012 | Apel et al. |
| 8,526,902 B2 | 9/2013 | Biber et al. |
| 2008/0252382 A1 | 10/2008 | Takagi |

(Continued)

OTHER PUBLICATIONS

Extended European Search Report dated May 16, 2018 in connection with Application No. EP 18 15 1948.9

*Primary Examiner* — Khanh V Nguyen
*Assistant Examiner* — Khiem D Nguyen
(74) *Attorney, Agent, or Firm* — Wolf, Greenfield & Sacks, P.C.

(57) ABSTRACT

A class-F power amplifier (PA) with a matching network is disclosed herein. The class-F PA comprises a first switch and a second switch operating in differential mode, with a second harmonic trap circuitry selectively terminating the drain terminals to ground at a second harmonic frequency. The second harmonic trap circuitry comprises a plurality of lumped inductive and capacitive components. The PA further comprises a common mode trap and a matching network to reduce the imbalance of the drain terminal impedance between first harmonics and third harmonics.

17 Claims, 6 Drawing Sheets

(51) Int. Cl.
*H03F 3/195* (2006.01)
*H03H 7/01* (2006.01)

(56) References Cited

U.S. PATENT DOCUMENTS

2015/0235971 A1 8/2015 Smith et al.
2016/0276997 A1 9/2016 Teramoto

CLASS-F POWER AMPLIFIER MATCHING NETWORK

RELATED APPLICATIONS

This Application claims the benefit under 35 U.S.C. § 119(e) of U.S. Provisional Patent Application Ser. No. 62/446,574, entitled "CLASS-F PA MATCHING NETWORK" filed on Jan. 16, 2017, which is hereby incorporated herein by reference in its entirety.

FIELD OF THE DISCLOSURE

The present application relates to circuitry, such as matching networks, that may be used in a class-F power amplifier.

BACKGROUND

A Power amplifier (PA) is used to receive an analog input signal and deliver an amplified signal with higher amplitude in an electronic device. Of particular interest is a PA that can amplify radio frequency (RF) input signals to drive a radio transmitter or an antenna in a transmitter for application in a battery-powered portable electronic device such as a wireless smart phone. Rapid growth in LTE smart phones has increased the demand for multiband PAs that have low cost and high efficiency. A high efficiency PA has a high ratio of delivered power compared to the total power consumed by the PA.

SUMMARY OF THE DISCLOSURE

According to an aspect of the present application, a class-F PA with a matching network, and a second harmonic trap circuit implemented with lumped inductive and capacitive components is described herein.

In some embodiments, a PA is provided. The PA comprises a first switch and a second switch. The first switch has a first drain terminal. The second switch has a second drain terminal. The first switch and the second switch are configured to receive differential signals corresponding to an input signal having a first harmonic frequency ($f_{H1}$), a second harmonic frequency ($f_{H2}$) and a third harmonic frequency ($f_{H3}$). The PA further comprises a second harmonic trap circuitry that is configured to be coupled to the first drain terminal and the second drain terminal. The second harmonic trap circuitry is configured to have a first impedance between the first drain terminal and a common voltage at $f_{H2}$, and a second impedance between the first drain terminal and the common voltage at $f_{H3}$. The first impedance is smaller than the second impedance. The second harmonic trap circuitry comprises a plurality of lumped inductive and capacitive components.

The second harmonic trap circuitry may be configured to have a third impedance between the second drain terminal and the ground at $f_{H2}$, and a fourth impedance between the second drain terminal and the ground terminal at $f_{H3}$, wherein the third impedance is smaller than the fourth impedance.

The second harmonic trap circuitry may be configured to provide a short between the first drain terminal and the ground, and between the second drain terminal and the ground at $f_{H2}$.

The first switch and the second switch may be Si MOS transistors on a semiconductor die.

The second harmonic trap circuitry may comprise a first node coupled to the first drain terminal by a first group of lumped inductive and capacitive components of the plurality of lumped inductive and capacitive components, and to the second drain terminal by a second group of lumped inductive and capacitive components of the plurality of lumped inductive and capacitive components, and wherein the first node is coupled to the ground by a common mode inductor.

The first group of lumped inductive and capacitive components may comprise a serial capacitor and a serial inductor.

The PA may further comprise a pair of differential output terminals coupled to the first and second drain terminal; and a matching network configured to be coupled between the pair of differential output terminals, the matching network having a single-ended output configured to be coupled to a load resistance, wherein the matching network is configured to match the impedance between the pair of differential output terminals and the load resistance.

The matching network may comprise a first matching capacitor coupled between the single-ended output and a first differential output terminal of the pair of differential output terminals; a second matching capacitor coupled between a second differential output terminal of the pair of differential output terminals and a second node; a first matching inductor coupled between the first differential output terminal and the second node; a second matching inductor coupled between the second differential output terminal and the single-ended output; and a ground network coupled between the ground and the second node, wherein the second node is connected to a terminal of a capacitor and a terminal of an inductor.

The ground network may be configured to have a first ground network impedance at $f_{H1}$, and a second ground network impedance at $f_{H3}$ different from the first ground network impedance.

The PA may further comprise a pair of differential output terminals coupled to the first and second drain terminal; and a common mode trap circuitry coupled between the pair of differential output terminals, wherein the common mode trap circuitry having a first circuit path in parallel with a second circuit path, wherein the first circuit path comprises inductive and capacitive components configured to short a common mode signal at the pair of differential output terminals to the ground at $f_{H1}$, and the first circuit path comprises inductive and capacitive components configured to short the common mode signal at the pair of differential output terminals to the ground at $f_{H3}$.

The matching network may comprise a transformer with a primary coil coupled between the pair of differential output terminals and a secondary coil coupled between a terminal of the load resistance and the ground.

The PA may further comprise a voltage supply, wherein the first drain terminal and the second drain terminal are connected to the voltage supply, and wherein the first switch, the second switch and the plurality of lumped inductive and capacitive components of the second harmonic trap circuitry are disposed on a first substrate, and the voltage supply and the matching network is disposed on a second substrate.

The magnitude of the first impedance may be less than 50% of the magnitude of the second impedance.

In some embodiments, a PA is provided. The PA comprises a first switch and a second switch configured to receive differential signals corresponding to an input signal having a first harmonic frequency ($f_{H1}$), a second harmonic frequency ($f_{H2}$) and a third harmonic frequency ($f_{H3}$). The PA further comprises a lumped component circuit configured to be coupled between a first drain terminal of the first switch and a second drain terminal of the second switch. The lumped component circuit has inductive components sized to resonate at $f_{H2}$ and configured to short the first drain terminal and the second drain terminal to a common voltage at $f_{H2}$.

The first switch and the second switch may be Si MOS transistors on a semiconductor die.

The lumped component circuit may comprise a first node coupled to the first drain terminal by a first serial capacitor and a first serial inductor, and to the second drain terminal by a second serial capacitor and a second serial inductor, and wherein the first node is coupled to the ground by a common mode inductor.

The PA may further comprise a pair of differential output terminals coupled to the first and second drain terminal; and a matching network coupled between the pair of differential output terminals, the matching network having a single-ended output coupled to a load resistance, wherein the matching network is configured to match the impedance between the pair of differential output terminals and the load resistance.

The matching network may comprise a first matching capacitor coupled between the single-ended output and a first differential output terminal of the pair of differential output terminals; a second matching capacitor coupled between a second differential output terminal of the pair of differential output terminals and a second node; a first matching inductor coupled between the first differential output terminal and the second node; a second matching inductor coupled between the second differential output terminal and the single-ended output; and a ground network coupled between the ground and the second node, wherein the second node is connected to a terminal of a capacitor and a terminal of an inductor and wherein the ground network is configured to have a first ground network impedance at $f_{H1}$, and a second ground network impedance at $f_{H3}$ different from the first ground network impedance.

The PA may further comprise a pair of differential output terminals coupled to the first and second drain terminal; and a common mode trap circuitry coupled between the pair of differential output terminals, wherein the common mode trap circuitry having a first circuit path in parallel with a second circuit path, wherein the first circuit path comprises inductive and capacitive components configured to short a common mode signal at the pair of differential output terminals to the ground at $f_{H1}$, and the first circuit path comprises inductive and capacitive components configured to short the common mode signal at the pair of differential output terminals to the ground at $f_{H3}$.

The matching network may comprise a transformer with a primary coil coupled between the pair of differential output terminals and a secondary coil coupled between a terminal of the load resistance and the ground.

BRIEF DESCRIPTION OF THE DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

DETAILED DESCRIPTION

Figure 1:
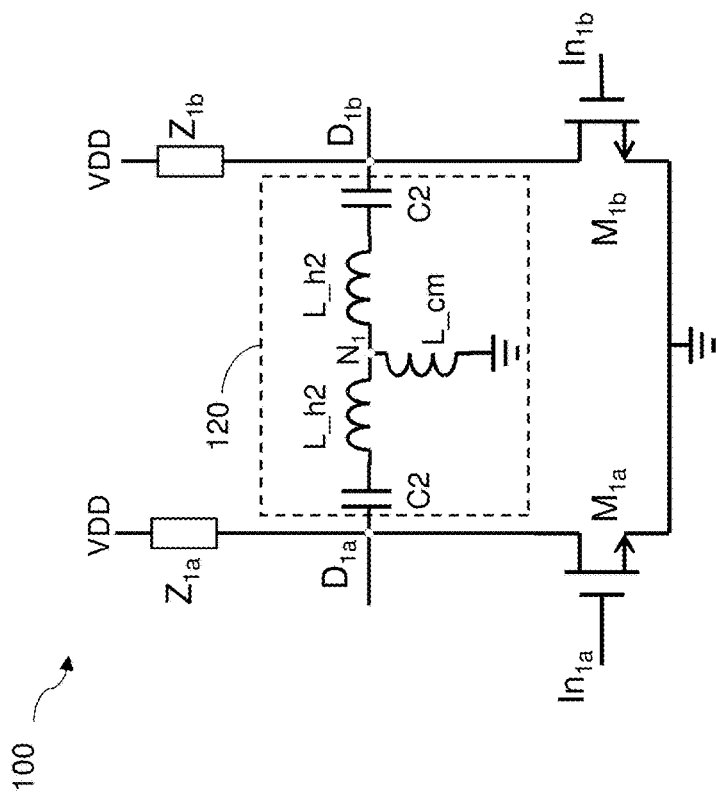
FIG. 1 is a schematic circuit diagram of an exemplary power amplifier 100, according to some aspects of the present disclosure.

Class A/B PAs may be relatively simple to design and to implement, but suffer from low efficiency. Class-F PAs, on the other hand, offer substantially increased efficiency compared to class A/B PAs. An input signal to the PA may be an analog RF signal that has a fundamental frequency that corresponds to a first harmonic frequency ($f_{H1}$) when the input signal is decomposed into a harmonic series or Fourier series comprising multiple order harmonic components (hereinafter also referred to as multiple order harmonics). The input signal has a multitude of harmonic frequencies, where each harmonic frequency is an integer multiple of the fundamental frequency. For example, the input signal may have a second harmonic frequency ($f_{H2}$) and a third harmonic frequency ($f_{H3}$) in its harmonic series that are twice and three times the fundamental frequency, respectively.

In a class-F PA, even order harmonics of the output signal at the drain terminal of a switch are attenuated, while odd order harmonics are maintained such that the output voltage waveform in the time domain is shaped similar to a square wave based on combination of the odd order harmonics. Because instantaneous power consumption of the amplifier is based on a product of the voltage and current at the switch, the near-square wave voltage waveform in the time domain when multiplied with the asynchronous current draw waveform in the time domain of the PA during the even harmonics will provide a low total power consumption and a correspondingly high efficiency. In designing class-F PA, impedance matching of the first three order harmonics is typically sufficient.

Aspects of the present application provide a class-F PA with a matching network, and a second harmonic trap circuit implemented with lumped inductive and capacitive components is described herein. The inventors have appreciated that while a class-F PA offers high efficiency compared with for example traditional class A/B PAs, the design of a class-F PA is generally more complex due to the requirement of impedance matching at multiple harmonic frequencies. According to an aspect of the present application, a matching network in a class-F PA performs impedance matching with a load at all three frequencies $f_{H1}$, $f_{H2}$ and $f_{H3}$. According to another aspect, a class-F PA based on metal-oxide semiconductor (MOS) switches such as silicon complementary-MOS (CMOS) switches may be fabricated using low cost and highly integrated Si-based semiconductor fabrication processing and can substantially lower the size and cost of a complex class-F PA.

In some embodiments, the input signal may have a fundamental frequency in the WCDMA/LTE frequency band for wireless applications, such as 824 to 849 MHz inclusive, 880 to 915 MHz inclusive, 1850 to 1910 MHz inclusive, and 1920 to 1980 MHz inclusive, although it should be appreciated that aspects of the present application are not so limited and an input signal of any RF fundamental frequency may be used with the power amplifiers disclosed herein.

The inventors have appreciated and recognized that to selectively attenuate the second harmonic frequency output impedance of the transistor switch at $f_{H2}$ in a class-F PA, a second harmonic trap circuitry may be provided. The inventors have appreciated that an RF transmission line may be used to attenuate the impedance at $f_{H2}$, by, for example, coupling a drain terminal of the switch with a transmission line having a quarter wavelength corresponding to $f_{H2}$. However, the inventors have also recognized that the use of transmission line has multiple limitations, such as higher cost related to providing a transmission line to a Si MOS device, as well as larger amplifier footprint associated with quarter wave transmission lines at common wireless communication frequencies, which is undesirable in small portable electronic devices. According to an aspect of the present application, a second harmonic trap circuitry is provided using lumped capacitive and inductive components such as passive capacitors and inductors, without the need to use any transmission line. Lumped capacitive and inductive components may be provided in the form of passive capacitors and inductors, as opposed to, for example, a quarter wave transmission line. The lumped components in the second harmonic trap circuitry are configured to form a lower impedance at $f_{H2}$ compared to $f_{H3}$ in order to attenuate the second order impedance, and in some embodiments the second harmonic trap circuitry is configured to form a short between a drain terminal of the switch to a common voltage at $f_{H2}$, and to form a high impedance between the drain terminal and the common voltage at $f_{H3}$. In some embodiments, the common voltage is a common reference voltage and may be a fixed voltage such as ground. In some embodiments, the lumped components in the second harmonic trap circuitry are formed on the same semiconductor die as the Si MOS switches of the class-F PA.

According to another aspect of the present application, a class-F PA has differential inputs received by two transistor switches. The difference between the differential inputs represents an input signal to be amplified. In some embodiments, the second harmonic trap circuitry comprises a T-shaped capacitive and inductive network coupled between a first drain terminal of a first switch, a second drain terminal of a second switch, and ground, such that independent control of common mode and differential mode impedance at the drain terminals of the two switches may be performed during amplifier design.

According to an aspect of the present application, a matching network is provided to convert differential-ended impedance between two differential output terminals of the class-F PA into single-ended output with a single-ended impedance that matches that of a load resistance.

Aspects of the present application may provide simultaneous impedance matching for the first three harmonics, while providing single-ended to differential-ended impedance conversion.

FIG. 1 is a schematic circuit diagram of an exemplary power amplifier 100, according to some aspects of the present disclosure. PA 100 is a class-F PA that comprises a first switch $M_{1a}$, a second switch $M_{1b}$, impedance $Z_{1a}$ and $Z_{1b}$, and a second harmonic trap circuitry 120.

In PA 100, the first switch $M_{1a}$ has a first input $In_{1a}$, a first drain terminal $D_{1a}$ and a source terminal connected to ground. The second switch $M_{1b}$ has a second input $In_{1b}$, a second drain terminal $D_{1b}$ and a source terminal connected to ground. The first drain terminal $D_{1a}$ is connected to a voltage supply VDD via impedance $Z_{1a}$. The second drain terminal $D_{1b}$ is connected to a voltage supply VDD via impedance $Z_{1b}$. Each of impedance $Z_{1a}$ and $Z_{1b}$ may be an inductive impedance that includes an inductor that couples the drain terminals to the voltage supply VDD, and may optionally and additionally include any parasitic inductive and capacitive impedance between wirings and interconnects in the package of the PA 100.

In the class-F PA 100, second harmonic trap circuitry 120 couples the drain terminals $D_{1a}$ and $D_{1b}$ to ground and is configured to have a first impedance between $D_{1a}$ and ground at the second harmonic frequency $f_{H2}$, and a second impedance between $D_{1a}$ and ground at the third harmonic frequency $f_{H3}$. During class-F PA operation, second harmonic trap circuitry 120 is configured to selectively attenuate the impedance between $D_{1a}$ and ground at $f_{H2}$ as opposed to $f_{H3}$. Therefore, in some embodiments the first impedance is smaller than the second impedance. In some embodiments, the magnitude of the first impedance may be less than 50% of the magnitude of the second impedance such that the impedance between $D_{1a}$ and ground at $f_{H2}$ as opposed to $f_{H3}$ In other embodiments, the magnitude of the first impedance may be less than 20%, less than 10%, less than 2%, less than 1%, less than 0.2%, less than 0.1%, between $1\times10^{-9}$ and $1\times10^{-2}$, between $1\times10^{-9}$ and $1\times10^{-3}$, between $1\times10^{-9}$ and $1\times10^{-4}$, between $1\times10^{-9}$ and $1\times10^{-5}$, or between $1\times10^{-9}$ and $1\times10^{-6}$ of the magnitude of the second impedance. According to some aspects of the present application, second harmonic trap circuitry 120 is configured to short $D_{1a}$ to ground at $f_{H2}$, or create a short circuit between $D_{1a}$ and ground at $f_{H2}$, whereas second harmonic trap circuitry 120 is configured to create an open circuit between $D_{1a}$ and ground at $f_{H3}$.

Similarly, the second harmonic trap circuitry 120 is configured to have a third impedance between $D_{1b}$ and ground at $f_{H2}$, and a fourth impedance between $D_{1b}$ and ground at $f_{H3}$, and the third impedance is smaller than the fourth impedance such that the impedance between $D_{1b}$ and ground is selectively attenuated at $f_{H2}$.

PA 100 is configured to operate in differential mode and the switches $M_{1a}$ and $M_{1b}$ in PA 100 are configured to receive differential signals at their respective inputs $In_{1a}$ and $In_{1b}$ that represents an input signal to be amplified.

In the exemplary embodiment illustrated in FIG. 1, the second harmonic trap circuitry 120 comprises a plurality of lumped inductive and capacitive components C2, L_h2 and L_cm forming a T-shaped capacitive and inductive network coupled between $D_{1a}$, $D_{1b}$ and ground. Specifically, a first group of lumped inductive and capacitive components comprising serial capacitor C2 and serial inductor L_h2 are coupled between $D_{1a}$ and a first node $N_1$, while a second group of lumped inductive and capacitive components comprising serial capacitor C2 and serial inductor L_h2 are coupled between $D_{1b}$ and $N_1$. N1 is coupled to the ground by an inductor L_cm.

According to an aspect of the present application, the second harmonic trap circuitry 120 may be a lumped component circuit having components C2, L_h2 and L_cm sized to have a resonance at $f_{H2}$, such that at $f_{H2}$, the lumped component circuit appears to short $D_{1a}$ and $D_{1b}$, respectively, to ground. In the exemplary circuit diagram shown in FIG. 1, the components may be sized such that C_h2 resonates with (L_h2+2×L_cm) at $f_{H2}$ to realize a short at $D_{1a}$ and $D_{1b}$.

Still referring to the lumped inductive and capacitive components in the second harmonic trap circuitry 120, at the higher third harmonic frequency $f_{3H}$, reactance due to C2 becomes smaller and the circuit 120 between $D_{1a}$ and $D_{1b}$ has an impedance that is dominated by the inductors such that the circuitry 120 forms a high impedance at $D_{1a}$ and $D_{1b}$ at $f_{3H}$.

During differential mode operation of PA 100, because the lumped capacitive and inductive components in the second harmonic trap circuitry 120 are sized to short $D_{1a}$ and $D_{1b}$ to ground at $f_{2H}$, for common mode signals at $D_{1a}$ and $D_{1b}$, the common mode impedance is shorted to ground via L_cm at $f_{2H}$. At the higher third harmonic frequency $f_{3H}$, differential mode impedance at $D_{1a}$ and $D_{1b}$ appears to be an impedance dominated by the inductors L_h2.

According to an aspect of the present application, L_h2 may be effectively regarded as a differential mode inductance L_dm, and be used to tune the differential mode third harmonic impedance, whereas the common mode inductance L_cm may be independently adjusted to tune the common mode impedance at the drain terminals of the switches. Therefore the exemplary second harmonic trap circuit 120 as shown in FIG. 1 may advantageously simply the design process to tailor the switch drain terminal impedance at both $f_{2H}$ and $f_{3H}$ by independently sizing two different groups of inductor values.

Figure 2:
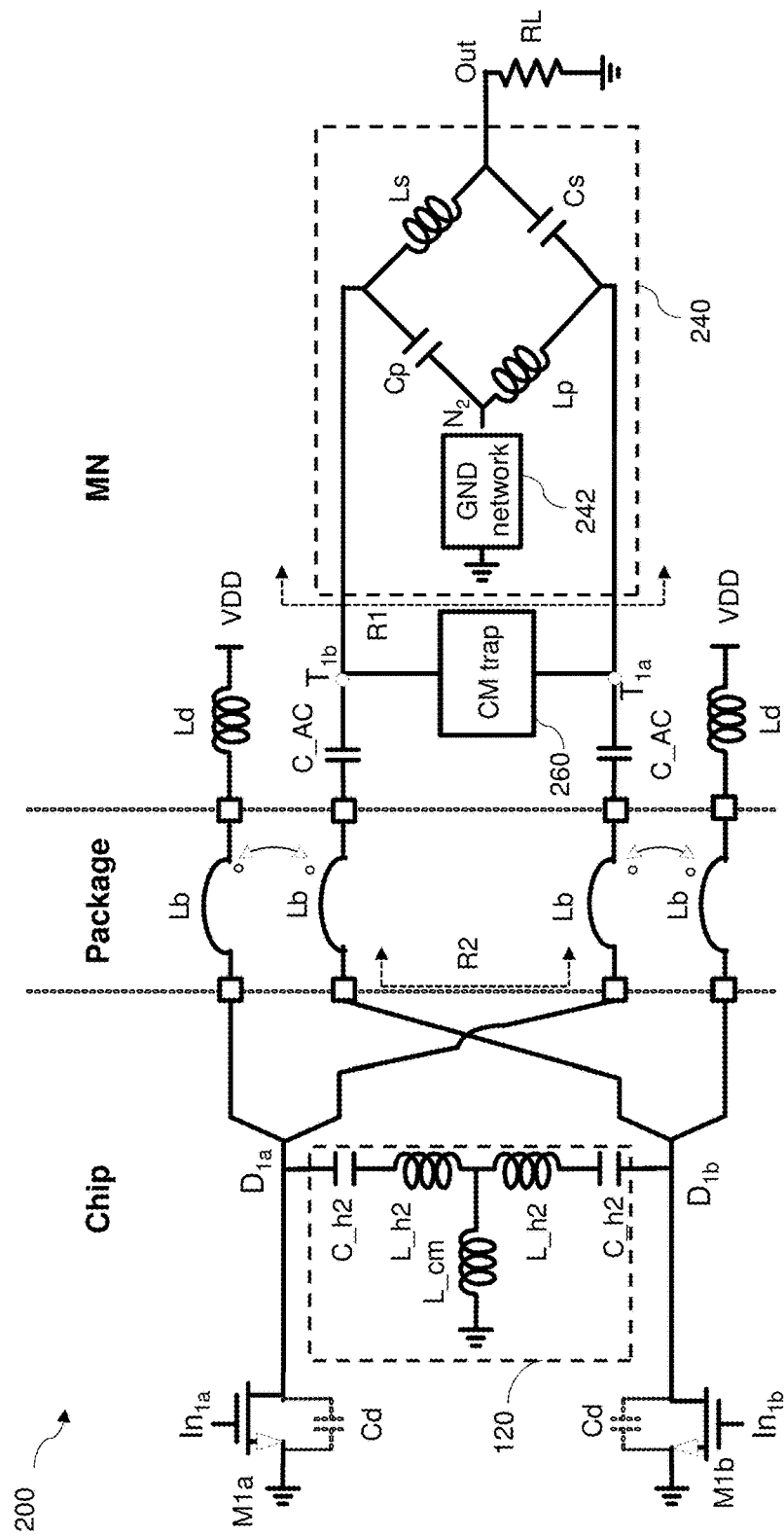
FIG. 2 is a schematic circuit diagram of an exemplary power amplifier 200, according to some aspects of the present disclosure.

FIG. 2 is a schematic circuit diagram of an exemplary power amplifier 200, according to some aspects of the present disclosure. PA 200 is a class-F PA that includes several of the components of PA 100 of FIG. 1, but differs in that it additionally includes a matching network 240 and a common mode trap circuitry 260.

In PA 200, the drain terminals $D_{1a}$ and $D_{1b}$ are each connected to VDD via a combination of inductor Ld and parasitic inductance Lb between wirings and interconnects in the package of the PA 200. For example, Lb may be parasitic inductance between the wire bonds used in the package of PA 200.

Optionally and additionally, a common mode trap circuitry 260 is provided in PA 200 and coupled between $T_{1b}$ and $T_{1a}$. The common mode trap circuitry 260 is configured for selectively terminating common mode currents to ground at $f_{1H}$ and $f_{3H}$. An exemplary implementation of the common mode trap circuitry 260 will be discussed below in relation to FIG. 4.

PA 200 includes a pair of differential output terminals $T_{1a}$, $T_{1b}$, each coupled to the respective drain terminals $D_{1a}$ and $D_{1b}$ via coupling capacitors C_AC. The matching network 240 converts an impedance R1 between the differential output terminals $T_{1a}$ and $T_{1b}$ to match a single-ended impedance RL connected to a single-ended output Out of the matching network.

At the second harmonic $f_{H2}$, C_h2 in the second harmonic trap circuitry 120 in PA 200 is configured to resonate with (L_h2+2×L_cm) at $f_{H2}$ to realize a short to ground at $D_{1a}$ and $D_{1b}$. Details of the design of the second harmonic trap circuitry 120 are discussed above in relation to PA 100 as shown in FIG. 1.

In PA 200 at the first harmonic $f_{H1}$, the load line impedance R2 is based on a resonance between the parasitic capacitance Cd at the first and second switches $M_{1a}$, $M_{1b}$, the lumped capacitive and inductive components in the second harmonic trap circuitry 120, and the inductances Lb+Ld.

Still referring to PA 200, at the third harmonic $f_{H3}$, the second harmonic trap circuitry 120 appears as a small inductance which dominates the other reactance such as Lb+Ld, and resonates with the parasitic capacitance Cd to form a high impedance at $D_{1a}$ and $D_{1b}$ at $f_{3H}$.

Thus PA 200 suppresses second harmonic impedance by shorting the drain terminals of the switches M1a, M1b to ground via the second harmonic trap circuitry at $f_{2H}$, and provides a load line differential impedance R2 between the drain terminals $D_{1a}$ and $D_{1b}$ at each of $f_{1H}$ and $f_{3H}$ to be matched to the load to implement class-F amplifier design.

In PA 200 shown in FIG. 2, matching network 240 converts and matches the single-ended impedance RL into R1, and then a L-matching network that includes the common mode trap circuitry 260, coupling capacitors C_AC to step down R1 to the load line differential impedance R2. Details of the matching network 240 and the common mode trap circuitry 260 are discussed in the following sections.

Figure 5:
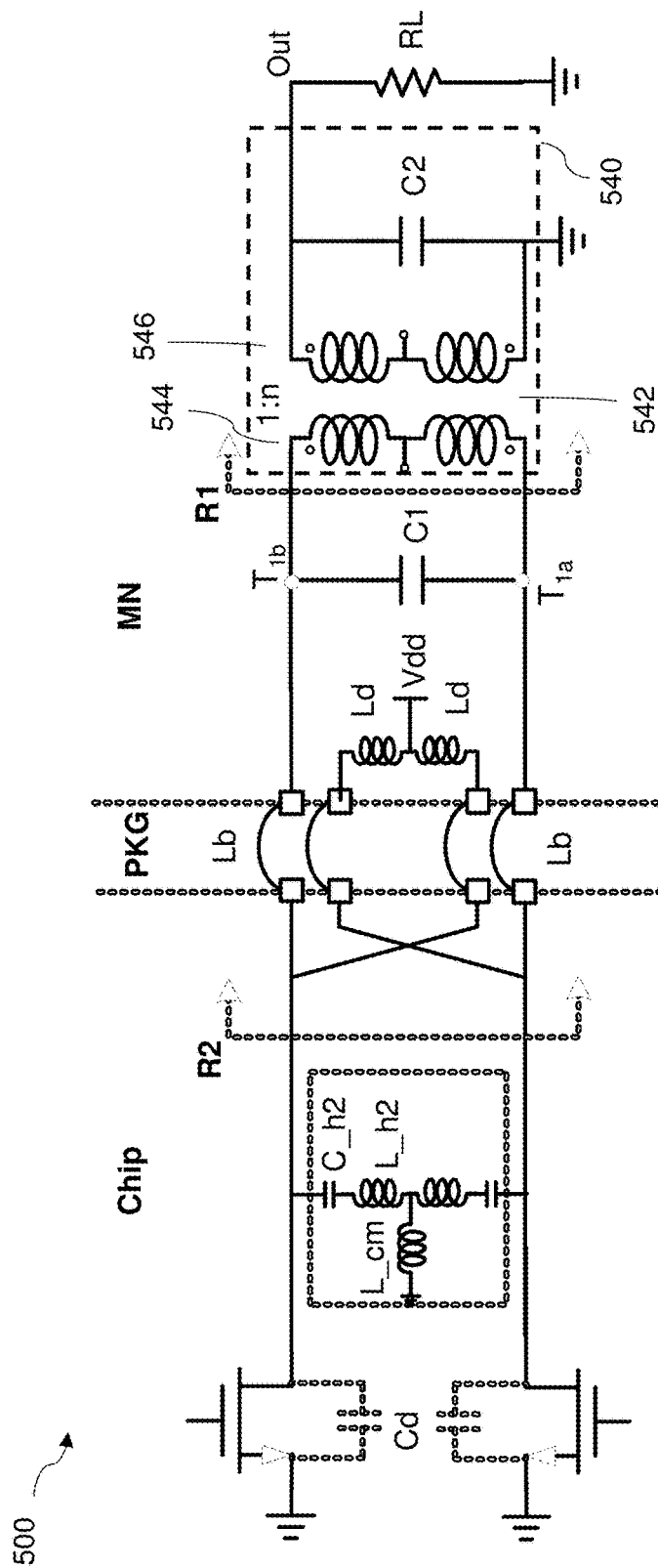
FIG. 5 is a schematic circuit diagram of an exemplary power amplifier 500, according to some aspects of the present disclosure.

As shown in FIG. 2, matching network 240 comprises a LC-CL network design. Specifically, matching network 240 includes a first matching capacitor Cs coupled between the single-ended output Out and $T_{1a}$, a second matching capacitor Cp coupled between $T_{1b}$ and a second node N2; a first matching inductor Lp coupled between $T_{1a}$ and N2, and a second matching inductor Ls coupled between $T_{1b}$ and the single-ended output Out. It should be appreciated that although an LC-CL network is illustrated in the embodiment shown in FIG. 2, the matching network 240 according to the present application is not so limited and other suitable impedance matching techniques may be used. For example, FIG. 5 shows another exemplary power amplifier with a matching network based on a transformer.

Still referring to the matching network 240 shown in FIG. 2, the LC-CL network comprising Cp, Cs, Lp, Ls do not always provide impedance matching at both $f_{1H}$ and $f_{3H}$. For example, an impedance R1 that is matched at the first harmonic frequency may be imbalanced with the corresponding impedance at the third harmonic frequency. A ground network 242 may be provided that couples between the second node N2 of the LC-CL network and ground. The ground network 242 may be configured to have different impedances between N2 and ground at $f_{1H}$ and $f_{3H}$.

Figure 3A:
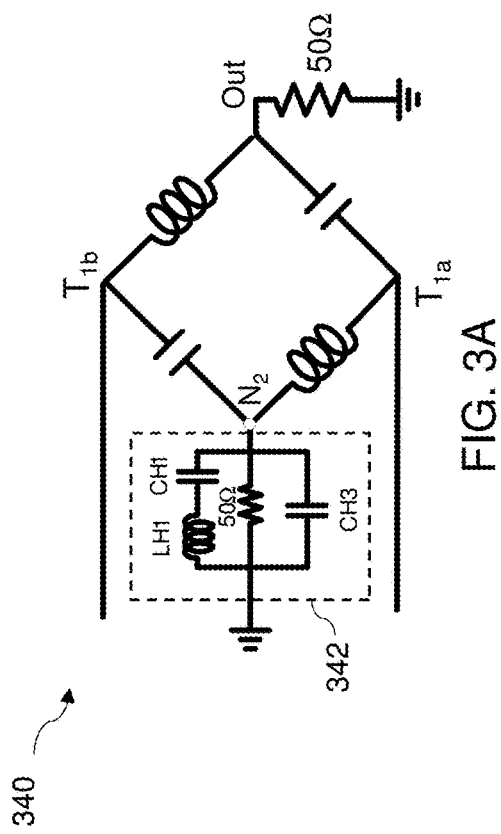
FIG. 3A is a schematic circuit diagram of an matching network 340 that is an example of the matching network 240 shown in FIG. 2, with a ground network 342, according to some aspects of the present disclosure.
Figure 3C:
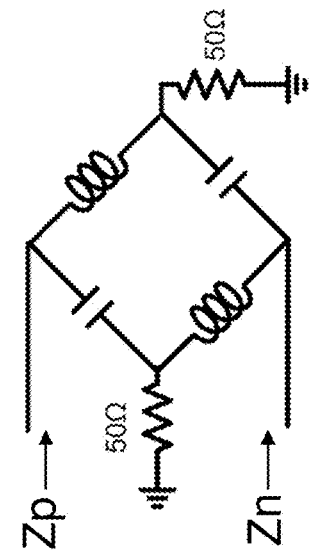
FIG. 3C is a schematic effective circuit diagram of the exemplary matching network 340 at $f_{H3}$, where the ground network appears effectively as a single resistor, according to some aspects of the present disclosure.
Figure 3B:
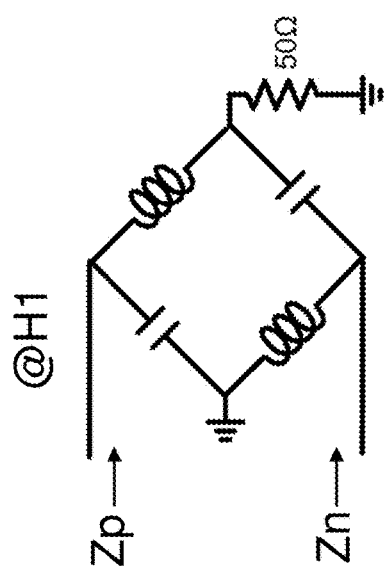
FIG. 3B is a schematic effective circuit diagram of the exemplary matching network 340 at the first harmonic frequency $f_{H1}$, according to some aspects of the present disclosure.

FIG. 3A is a schematic circuit diagram of an matching network 340 that is an example of the matching network 240 shown in FIG. 2, with a ground network 342, according to some aspects of the present disclosure. The ground network 342 includes a serial capacitor CH1 and a serial inductor LH1, in parallel with a resistor and further in parallel with a capacitor CH3, configured to be coupled between ground and the second node N2 of the LC-CL network. FIG. 3B is a schematic effective circuit diagram of the exemplary matching network 340 at $f_{H1}$, where the ground network appears as a short when LH1 and CH1 are configured to resonate at $f_{1H}$. FIG. 3C is a schematic effective circuit diagram of the exemplary matching network 340 at $f_{H3}$, where the ground network appears effectively as a single resistor. Thus the difference between impedances at $f_{H1}$ and $f_{H3}$ in the matching network 340 may be selectively balanced with the ground network 342.

Figure 4:
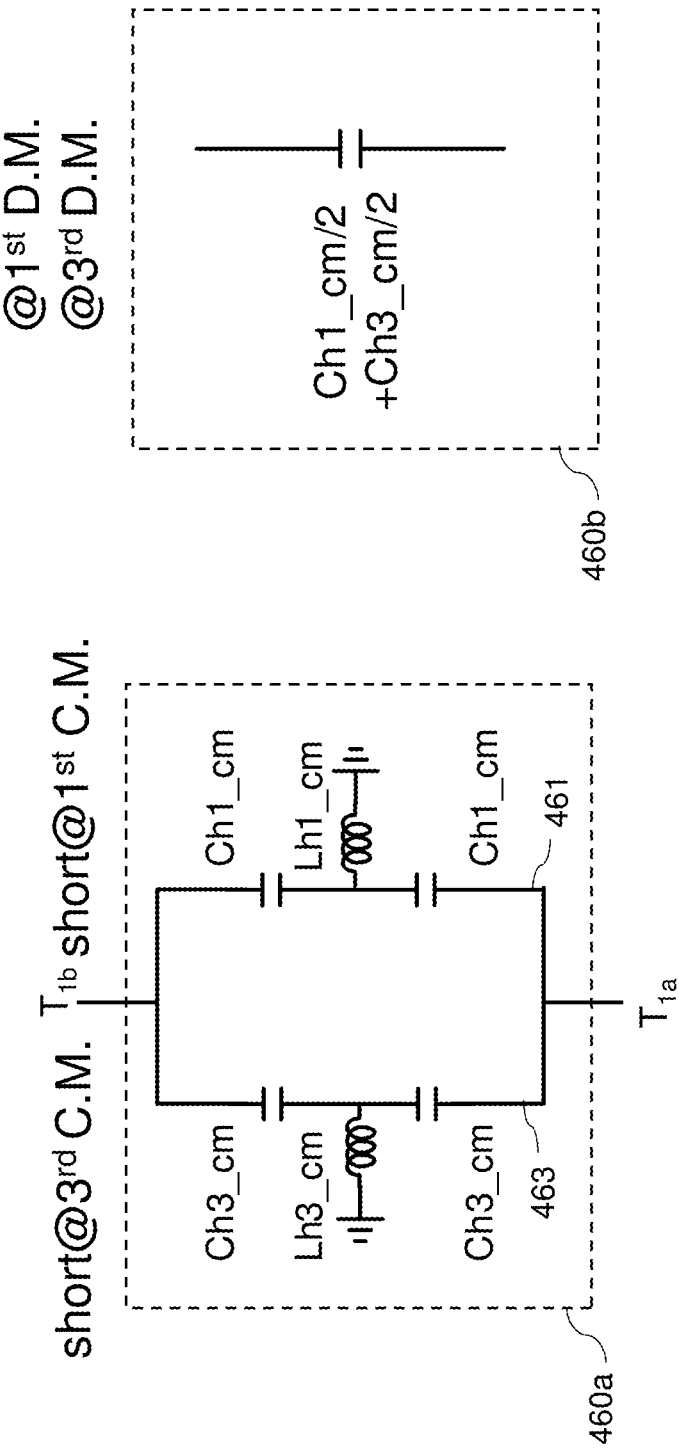
FIG. 4 is a schematic circuit diagram of a common mode trap circuitry 460a that is an example of the common mode trap circuitry 260 shown in FIG. 2, and an equivalent differential mode circuit 460b of the common mode trap circuitry 460a, according to some aspects of the present disclosure.

FIG. 4 is a schematic circuit diagram of a common mode trap circuitry 460a that is an example of the common mode trap circuitry 260 shown in FIG. 2, and an equivalent differential mode circuit 460b of the common mode trap circuitry 460a, according to some aspects of the present disclosure. The inventors have recognized and appreciated that, practically, the impedance of the LC-CL matching network 240 shown in FIG. 2 may be imbalanced between the first and third harmonics due to finite Q-factor in components in the matching network 240. A common mode trap may remove such impedance imbalance by selectively terminating common mode currents at $f_{1H}$ and $f_{3H}$.

As shown, common mode trap circuitry 460a has a first circuit path 461 in parallel with a second circuit path 463 and both coupled between the differential output terminals $T_{1a}$ and $T_{1b}$. The first circuit path 461 includes two capacitors Ch1_cm and an inductor Lh1_cm in a T-shaped network with the inductor Lh1_cm coupling a shared node between the two capacitors Ch1_cm to ground. The Ch1_cm is configured to resonate with LH1_cm at $f_{1H}$ such that the first circuit path 461 effectively terminates common mode currents at $T_{1a}$ and $T_{1b}$ to ground at $f_{1H}$. Similarly, the second circuit path 463 includes two capacitors Ch3_cm and an inductor Lh3_cm in a T-shaped network with the inductor Lh3_cm coupling a shared node between the two capacitors Ch3_cm to ground. The Ch3_cm is configured to resonate with LH3_cm at $f_{3H}$ such that the second circuit path 463 effectively terminates common mode currents at $T_{1a}$ and $T_{1b}$ to ground at $f_{3H}$.

FIG. 4 also shows the equivalent differential mode circuit 460b, where the common mode trap circuitry 460a appears as a capacitance based on Ch1_cm/2+Ch3_cm/2.

FIG. 5 is a schematic circuit diagram of an exemplary power amplifier 500, according to some aspects of the present disclosure. PA 500 is a class-F PA that includes several of the components of PA 200 of FIG. 2, but differs in that it includes a transformer-based matching network 540. As shown, a matching transformer 542 is provided to convert the differential impedance between $T_{1b}$ and $T_{1a}$ to the single-ended impedance of the load RL. Matching transformer 542 has a first coil 544 coupled between $T_{1b}$ and $T_{1a}$, and a second coil 546 coupled between a single-ended output Out and ground.

Figure 6:
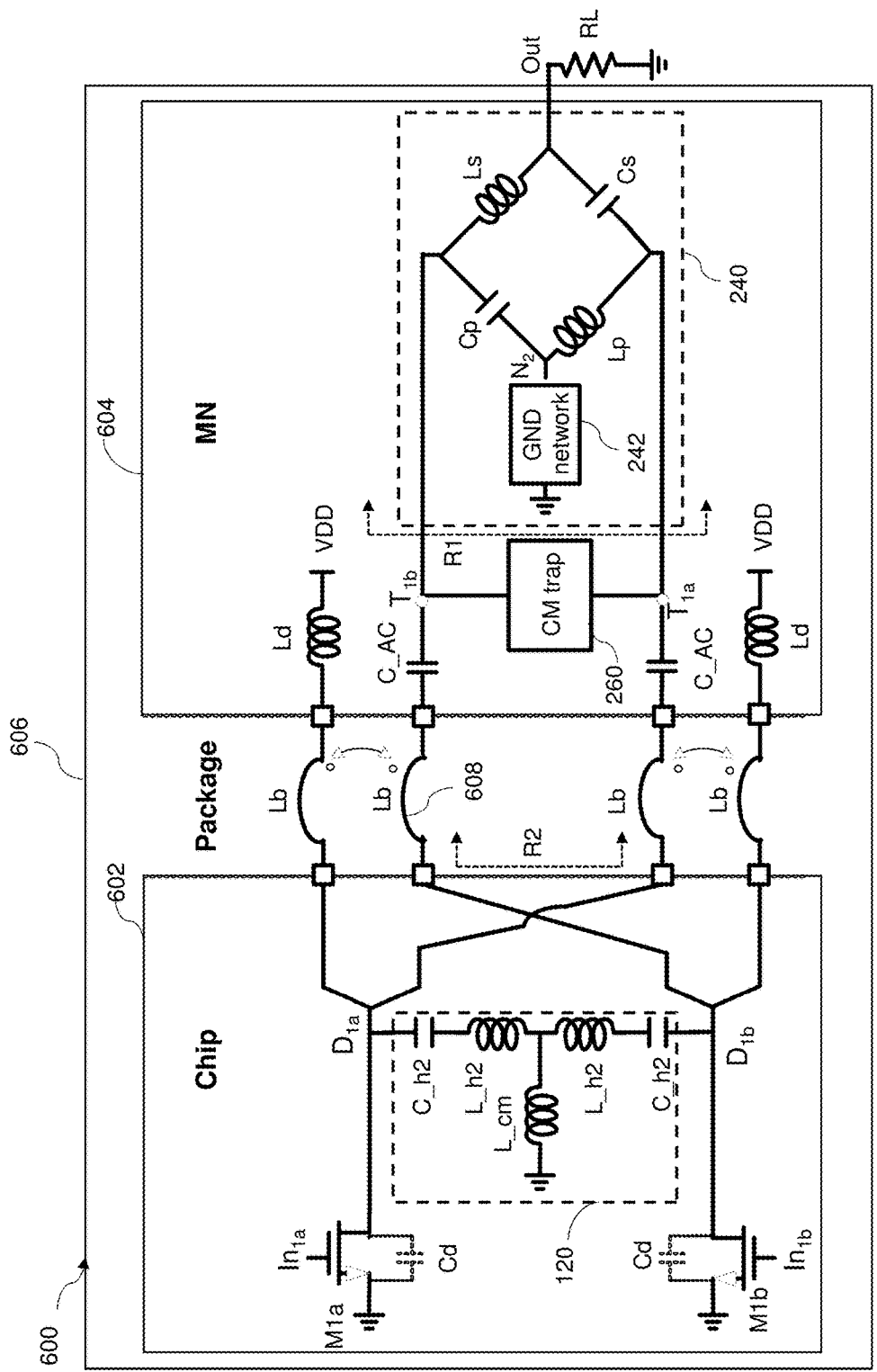
FIG. 6 is a schematic diagram of an exemplary power amplifier 600, according to some aspects of the present disclosure.

FIG. 6 is a schematic diagram of an exemplary power amplifier 600, according to some aspects of the present disclosure. PA 600 is a class-F PA that implements several of the components of PA 200 of FIG. 2 on a first substrate 602 and a second substrate 606, in a package 606.

According to an aspect of the present application, the first switch and the second switch $M_{1a}$ and $M_{1b}$ of PA 600 as shown in FIG. 6 may be Si MOS transistors formed on a semiconductor die in the first substrate 602 using any suitable semiconductor processing technique to reduce device fabrication cost. In an embodiment, the lumped capacitive and inductive components in the second harmonic trap circuitry 120 are disposed on the first substrate 602 to reduce fabrication cost and reduce amplifier footprint by any suitable, such as but not limited to fabricating metal traces or interconnects in the substrate 602, bonding lumped passive elements to the substrate 602, or bonding an interposer substrate comprising passive capacitive and inductive components to the substrate 602. As shown in FIG. 6, the drain terminals D1a, D1b are connected to voltage supply VDD by bonding wires 608, although any suitable interconnect technique may be used for the connection. The voltage supply VDD, inductor Ld, common mode trap 260 and matching network 240 are disposed on a second substrate 604. Any suitable technique may be used to fabricate various components on the substrate 604. In a non-limited example, substrate 604 may be an integrated passive device (IPD) die. Substrate 602 and 604 may be disposed on a package 606, although it should be appreciated that such arrangement is by way of an example only and should not be viewed as limiting, as other packaging arrangements may be possible.

The terms "approximately" and "about" may be used to mean within ±20% of a target value in some embodiments, within ±10% of a target value in some embodiments, within ±5% of a target value in some embodiments, or within ±2% of a target value in some embodiments. The terms "approximately" and "about" may include the target value.

Various aspects of the apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A power amplifier comprising:
   a first switch comprising a first drain terminal;
   a second switch comprising a second drain terminal, wherein the first switch and the second switch are configured to receive differential signals representing an input signal, the input signal having a first harmonic frequency ($f_{H1}$), a second harmonic frequency ($f_{H2}$) and a third harmonic frequency ($f_{H3}$);
   a second harmonic trap circuitry configured to be coupled to the first drain terminal and the second drain terminal, and configured to have a first impedance between the first drain terminal and a common voltage at the second harmonic frequency, and a second impedance between the first drain terminal and the common voltage at the third harmonic frequency, wherein the first impedance is smaller than the second impedance, and wherein the second harmonic trap circuitry comprises a plurality of lumped inductive and capacitive components;
   a pair of differential output terminals coupled to the first and second drain terminals; and
   a common mode trap circuitry coupled between the pair of differential output terminals, wherein the common mode trap circuitry having a first circuit path in parallel with a second circuit path, wherein the first circuit path comprises inductive and capacitive components configured to short a common mode signal at the pair of differential output terminals to the common voltage at the first harmonic frequency, and the second circuit path comprises inductive and capacitive components configured to short the common mode signal at the pair of differential output terminals to the common voltage at the third harmonic frequency.

2. The power amplifier of claim 1, wherein:
the second harmonic trap circuitry is configured to have a third impedance between the second drain terminal and the common voltage at the second harmonic frequency, and a fourth impedance between the second drain terminal and the common voltage at the third harmonic frequency, wherein the third impedance is smaller than the fourth impedance.

3. The power amplifier of claim 1, wherein:
the second harmonic trap circuitry is configured to provide a short between the first drain terminal and the common voltage, and between the second drain terminal and the common voltage at the second harmonic frequency.

4. The power amplifier of claim 1, wherein:
the first switch and the second switch are Si MOS transistors on a semiconductor die.

5. The power amplifier of claim 1, wherein:
the second harmonic trap circuitry comprises a first node coupled to the first drain terminal by a first group of lumped inductive and capacitive components of the plurality of lumped inductive and capacitive components, and to the second drain terminal by a second group of lumped inductive and capacitive components of the plurality of lumped inductive and capacitive components, and wherein
the first node is coupled to the common voltage by a common mode inductor.

6. The power amplifier of claim 5, wherein:
the first group of lumped inductive and capacitive components comprises a serial capacitor and a serial inductor.

7. The power amplifier of claim 1, further comprising:
a pair of differential output terminals coupled to the first and second drain terminals; and
a matching network configured to be coupled between the pair of differential output terminals, the matching network having a single-ended output configured to be coupled to a load resistance, wherein the matching network is configured to match an impedance between the pair of differential output terminals and the load resistance.

8. The power amplifier of claim 7, wherein:
the matching network comprises a first matching capacitor coupled between the single-ended output and a first differential output terminal of the pair of differential output terminals; a second matching capacitor coupled between a second differential output terminal of the pair of differential output terminals and a second node; a first matching inductor coupled between the first differential output terminal and the second node; a second matching inductor coupled between the second differential output terminal and the single-ended output; and
a ground network coupled between the common voltage and the second node, wherein the second node is connected to a terminal of a capacitor and a terminal of an inductor.

9. The power amplifier of claim 8, wherein:
the ground network is configured to have a first ground network impedance at the first harmonic frequency, and a second ground network impedance at the third harmonic frequency different from the first ground network impedance.

10. The power amplifier of claim 7, wherein:
the matching network comprises a transformer with a primary coil coupled between the pair of differential output terminals and a secondary coil coupled between a terminal of the load resistance and the common voltage.

11. The power amplifier of claim 7, further comprising a voltage supply, wherein:
the first drain terminal and the second drain terminal are connected to the voltage supply, and wherein
the first switch, the second switch and the plurality of lumped inductive and capacitive components of the second harmonic trap circuitry are disposed on a first substrate, and
the voltage supply and the matching network is disposed on a second substrate.

12. The power amplifier of claim 1, wherein:
the magnitude of the first impedance is less than 50% of the magnitude of the second impedance.

13. A power amplifier comprising:
a first switch and a second switch configured to receive differential signals representing an input signal, the input signal having a first harmonic frequency ($f_{H1}$), a second harmonic frequency ($f_{H2}$) and a third harmonic frequency ($f_{H3}$);
a lumped component circuit configured to be coupled between a first drain terminal of the first switch and a second drain terminal of the second switch, the lumped component circuit having inductive components sized to resonate at the second harmonic frequency and configured to short the first drain terminal and the second drain terminal to a common voltage at the second harmonic frequency;
a pair of differential output terminals coupled to the first and second drain terminals;
a matching network coupled between the pair of differential output terminals, the matching network having a single-ended output coupled to a load resistance, wherein the matching network is configured to match an impedance between the pair of differential output terminals and the load resistance, wherein:
the matching network comprises a first matching capacitor coupled between the single-ended output and a first differential output terminal of the pair of differential output terminals; a second matching capacitor coupled between a second differential output terminal of the pair of differential output terminals and a second node; a first matching inductor coupled between the first differential output terminal and the second node; a second matching inductor coupled between the second differential output terminal and the single-ended output; and
a ground network coupled between the common voltage and the second node, wherein the second node is connected to a terminal of a capacitor and a terminal of an inductor and wherein the ground network is configured to have a first ground network impedance at the first harmonic frequency, and a second ground network impedance at the third harmonic frequency different from the first ground network impedance.

14. The power amplifier of claim 13, wherein:
the first switch and the second switch are Si MOS transistors on a semiconductor die.

15. The power amplifier of claim 13, wherein:
the lumped component circuit comprises a first node coupled to the first drain terminal by a first serial capacitor and a first serial inductor, and to the second drain terminal by a second serial capacitor and a second serial inductor, and wherein
the first node is coupled to the common voltage by a common mode inductor.

16. The power amplifier of claim 13, further comprising:
a pair of differential output terminals coupled to the first and second drain terminals; and
a common mode trap circuitry coupled between the pair of differential output terminals, wherein the common mode trap circuitry having a first circuit path in parallel with a second circuit path, wherein the first circuit path comprises inductive and capacitive components configured to short a common mode signal at the pair of differential output terminals to the common voltage at the first harmonic frequency, and the first circuit path comprises inductive and capacitive components configured to short the common mode signal at the pair of differential output terminals to the common voltage at the third harmonic frequency.

17. A power amplifier comprising:
a first switch and a second switch configured to receive differential signals representing an input signal, the input signal having a first harmonic frequency ($f_H$), a second harmonic frequency ($f_{H2}$) and a third harmonic frequency ($f_{H3}$);
a lumped component circuit configured to be coupled between a first drain terminal of the first switch and a second drain terminal of the second switch, the lumped component circuit having inductive components sized to resonate at the second harmonic frequency and configured to short the first drain terminal and the second drain terminal to a common voltage at the second harmonic frequency;
a pair of differential output terminals coupled to the first and second drain terminals; and
a matching network coupled between the pair of differential output terminals, the matching network having a single-ended output coupled to a load resistance, wherein the matching network is configured to match an impedance between the pair of differential output terminals and the load resistance, wherein:
the matching network comprises a transformer with a primary coil coupled between the pair of differential output terminals and a secondary coil coupled between a terminal of the load resistance and the common voltage.

* * * * *